(12) United States Patent
Di Teodoro et al.

(10) Patent No.: US 12,199,400 B2
(45) Date of Patent: Jan. 14, 2025

(54) HIGH-PULSE-CONTRAST FIBER LASER TRANSMITTERS

(71) Applicant: Raytheon Company, Waltham, MA (US)

(72) Inventors: Fabio Di Teodoro, Hacienda Heights, CA (US); David A. Rockwell, Culver City, CA (US)

(73) Assignee: Raytheon Company, Tewksbury, MA (US)

( * ) Notice: Subject to any disclaimer, the term of this patent is extended or adjusted under 35 U.S.C. 154(b) by 983 days.

(21) Appl. No.: 17/194,852

(22) Filed: Mar. 8, 2021

(65) Prior Publication Data

US 2022/0285904 A1    Sep. 8, 2022

(51) Int. Cl.
| | |
|---|---|
| *H01S 3/23* | (2006.01) |
| *H01S 3/067* | (2006.01) |
| *H01S 3/094* | (2006.01) |
| *H01S 3/16* | (2006.01) |
| *H01S 3/30* | (2006.01) |

(52) U.S. Cl.
CPC ........ *H01S 3/2316* (2013.01); *H01S 3/06716* (2013.01); *H01S 3/06754* (2013.01); *H01S 3/094076* (2013.01); *H01S 3/1616* (2013.01); *H01S 3/1618* (2013.01); *H01S 3/302* (2013.01); *H01S 2301/02* (2013.01)

(58) Field of Classification Search
None
See application file for complete search history.

(56) References Cited

U.S. PATENT DOCUMENTS

| | | | | |
|---|---|---|---|---|
| 5,177,634 | A * | 1/1993 | Way | H01S 3/06758 359/337 |
| 6,340,806 | B1 * | 1/2002 | Smart | B23K 26/0624 257/E23.15 |
| 9,952,315 | B2 | 4/2018 | Boland et al. | |
| 10,114,107 | B2 | 10/2018 | Boland et al. | |
| 2005/0238070 | A1 * | 10/2005 | Imeshev | G02F 1/39 359/326 |
| 2008/0151359 | A1 * | 6/2008 | Yoshida | H01S 3/302 359/334 |
| 2015/0131145 | A1 * | 5/2015 | Rowen | H01S 3/1618 359/334 |

(Continued)

OTHER PUBLICATIONS

Agrawal, "Nonlinear Fiber Optics, Third Edition, Chapter 8 Stimulated Raman Scattering," Optics and Photonics, Academic Press, 2001, 11 pages.

(Continued)

*Primary Examiner* — Eric L Bolda

(57) ABSTRACT

A system includes a signal seeder configured to generate a pulsed seed signal, where the signal seeder includes a master oscillator configured to generate an optical signal at a first wavelength. The system also includes a series of optical preamplifiers collectively configured to amplify the pulsed seed signal and generate an amplified signal. The system further includes a Raman fiber amplifier configured to amplify the amplified signal and generate a Raman-shifted amplified signal. The Raman fiber amplifier is configured to shift a wavelength of the amplified signal to a second wavelength different than the first wavelength during generation of the Raman-shifted amplified signal.

20 Claims, 6 Drawing Sheets

(56) References Cited

U.S. PATENT DOCUMENTS

2017/0294754 A1* 10/2017 Leonardo ............ H01S 3/06758
2018/0175581 A1*  6/2018 Di Teodoro ........ H01S 3/10092

OTHER PUBLICATIONS

Hardy et al., "Signal Amplification in Strongly Pumped Fiber Amplifiers," IEEE Journal of Quantum Electronics, vol. 33, No. 3, Mar. 1997, 7 pages.
Ma et al., "Kilowatt-level Yb-Raman fiber amplifier with narrow-linewidth and near-diffraction-limited beam quality," arXiv:1910.12215, Oct. 2019, 7 pages.
Obaid et al., "Novel Flat-Gain L-band Raman/Er—Yb Co-doped Fiber Hybrid Optical Amplifier for High Capacity DWDM System," Optik—International Journal for Light and Electron Optics, Sep. 2018, 12 pages.

* cited by examiner

HIGH-PULSE-CONTRAST FIBER LASER TRANSMITTERS

TECHNICAL FIELD

This disclosure is generally directed to laser systems. More specifically, this disclosure is directed to high-pulse-contrast fiber laser transmitters.

BACKGROUND

Pulsed fiber lasers (PFLs) have been effectively used as laser transmitters for various applications, such as in light detection and ranging (LiDAR), remote sensing, and free-space laser communication (lasercom) systems. These various applications may be collectively said to involve the use of optical sensing transceivers (OSTs). Pulsed fiber lasers are very attractive in terms of reliability, compact packaging, and ruggedness. These features facilitate the deployment of pulsed fiber laser-based optical sensing transceivers in a number of environments, including harsh environments and platforms that are subject to severe thermo-mechanic stresses.

SUMMARY

This disclosure provides high-pulse-contrast fiber laser transmitters.

In a first embodiment, a system includes a signal seeder configured to generate a pulsed seed signal, where the signal seeder includes a master oscillator configured to generate an optical signal at a first wavelength. The system also includes a series of optical preamplifiers collectively configured to amplify the pulsed seed signal and generate an amplified signal. The system further includes a Raman fiber amplifier configured to amplify the amplified signal and generate a Raman-shifted amplified signal. The Raman fiber amplifier is configured to shift a wavelength of the amplified signal to a second wavelength different than the first wavelength during generation of the Raman-shifted amplified signal.

In a second embodiment, a method includes generating a pulsed seed signal based on an optical signal at a first wavelength. The method also includes amplifying the pulsed seed signal to generate an amplified signal using a series of optical preamplifiers. The method further includes amplifying the amplified signal to generate a Raman-shifted amplified signal using a Raman fiber amplifier. The Raman fiber amplifier shifts a wavelength of the amplified signal to a second wavelength different than the first wavelength during generation of the Raman-shifted amplified signal.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
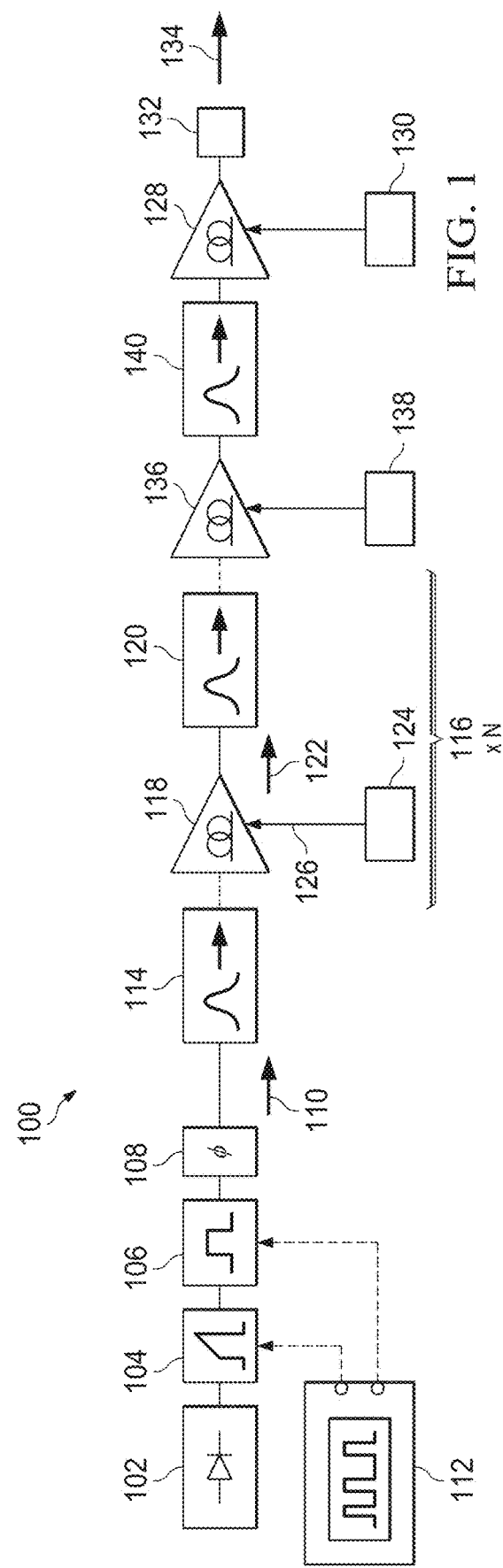
FIG. 1 illustrates a first example high-pulse-contrast fiber laser transmitter according to this disclosure.

FIGS. 1 through 10, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, pulsed fiber lasers (PFLs) have been effectively used as laser transmitters for various applications, such as in light detection and ranging (LiDAR), remote sensing, and free-space laser communication (lasercom) systems. These various applications may be collectively said to involve the use of optical sensing transceivers (OSTs). Pulsed fiber lasers are very attractive in terms of reliability, compact packaging, and ruggedness. These features facilitate the deployment of pulsed fiber laser-based optical sensing transceivers in a number of environments, including harsh environments and platforms that are subject to severe thermo-mechanic stresses.

In some cases, pulsed fiber lasers can be constructed as all-fusion-spliced chains of components resembling electronic circuits without the use of free-space bulk optics that are subject to misalignment. Moreover, fibers can be tightly coiled or laid out in a free-form manner to fit into small spaces or occupy oddly-shaped enclosures. In addition, pulsed fiber lasers are electro-optically efficient, thermally manageable, and naturally prone to emitting an optical beam of good spatial quality via controlled optical wave-guidance. Thus, pulsed fiber lasers are inherently suitable for many demanding optical sensing transceiver applications, such as those that involve high laser pulse repetition rates (such as up to multi-megahertz or gigahertz applications) and high average laser powers.

Unfortunately, pulsed fiber laser-based transmitters often exhibit insufficient or poor optical pulse contrast (OPC), which is defined as the ratio between (i) pulse energy and (ii) "leakage" energy temporally occurring between pulses. Often times, the leakage energy is caused by amplified spontaneous emissions (ASE) in a fiber amplifier. Some applications may be particularly demanding in terms of optical pulse contrast, such as photon-counting LiDAR applications in which ASE can hinder the detection of a LiDAR return signal by causing spurious photon counts and detector saturation.

While some approaches have been developed to help improve optical pulse contrast, these approaches often suffer from various shortcomings. For example, relatively high output optical pulse contrast may be obtained using actively or passively Q-switched lasers, such as Q-switched fiber lasers. In these approaches, a laser cavity leaks negligible light between pulses because it is optically closed or blocked by a Q-switch, which is typically implemented using an intra-cavity acousto-optic or electro-optic modulator or a saturable absorber. The Q-switch allows for energy storage in a laser gain medium and is opened only for a short time, which may correspond to the desired pulse duration. In these lasers, the output optical pulse contrast typically corresponds to the on/off extinction of the Q-switch and can easily exceed 50 decibels.

However, Q-switched lasers typically have poor control of pulse timing and temporal format. For example, in passively Q-switched lasers, the pulse repetition frequency (PRF) is usually not electronically controllable, and the pulse-to-pulse time interval may vary stochastically by amounts that far exceed an individual pulse duration. Optical sensing transceivers often require a very precise timing relationship between a laser transmitter and an optical receiver, which is often dictated by an electronic system master clock. Laser transmitters with large pulse time jitters are generally incompatible with such externally-clocked operations and would have to serve themselves as the clock, which complicates the OST opto-electronic design and greatly reduces operational flexibility. While the pulse time jitter can be somewhat reduced in actively Q-switched lasers, the optical pulse format still remains constrained, typically where longer laser cavities and higher pulse repetition frequencies are associated with longer pulse widths. As Q-switched fiber laser cavities are typically more than one meter in length, the corresponding pulse width often exceeds 10 nanoseconds, which can severely limit an optical sensing transceiver's range resolution and/or optical data stream bandwidth. Moreover, a Q-switching modulator typically includes a bulk free-space component capable of withstanding high intra-cavity pulse power/optical intensity and is thus not consistent with rugged all-fiber architectures. Other pulsed laser architectures, such as mode-locked and Q-switched/mode-locked architectures, can exhibit architectural or pulse format features that are similarly incompatible with OST operations.

Another approach for increasing optical pulse contrast is to use a time-gating component (TGC), such as an electro-optic or acousto-optic intensity modulator, which may be similar to a Q-switch but is not installed within a laser cavity. The time-gating component can be highly transmissive during a time window set to be the same as or slightly longer than the temporal width of emitted laser pulses and time-synchronized with the emission of such pulses. Outside this time window (between laser pulses), the time-gating component blocks light, either by absorbing it or deflecting it. This solution is compatible with master-oscillator/power-amplifier (MOPA) laser architectures in which components controlling optical-pulse characteristics are functionally separated from those dedicated to obtaining high pulse powers. Such laser architectures may be more suitable for use in optical sensing transceivers than power laser oscillators, including Q-switched lasers. In fact, pulsed fiber lasers for optical sensing transceivers are oftentimes themselves configured using MOPA designs. However, to obtain the highest optical pulse contrast, the time-gating component would need to gate the full emission of the MOPA architecture and thus be located at the output end of the MOPA architecture. With this arrangement, the time-gating component would need to be implemented using high-damage-threshold bulk free-space components capable of withstanding the full emitted laser power, which again is not consistent with all-fiber architectures.

One approach for increasing the optical pulse contrast of a MOPA architecture involves using a nonlinear wavelength converter (NLWC) that is positioned at the output end of a pulsed MOPA architecture. Since nonlinear optical effects are strongly power-dependent, nonlinear wavelength converters effectively convert pulsed power and are much less effective at converting low-power light between pulses, which improves the optical pulse contrast. However, nonlinear wavelength converters introduce unrecoverable optical losses, which increase power consumption and degrade efficiency. Also, nonlinear wavelength converters may produce very significant wavelength shifts, and a new wavelength may not be compatible with optical receivers or specific applications. Further, many nonlinear wavelength converters require phase-matching to operate efficiently, which means that the nonlinear wavelength converters are very sensitive to temperature variations and variations in input beam incidence angle. This may complicate opto-mechanical designs by requiring active thermal management and/or increase the performance sensitivity to thermo-mechanical perturbations typically occurring in field-deployed platforms. In addition, appreciable heat may be deposited into bulk nonlinear wavelength converters due to extrinsic or intrinsic optical absorptions, and significant thermal loading of the nonlinear wavelength converters can result in thermo-optical beam quality degradations. Finally, any type of bulk nonlinear wavelength converter is again not consistent with all-fiber architectures.

This disclosure provides various pulsed fiber laser-based architectures that achieve high optical pulse contrast values. Each pulsed fiber laser-based architecture is compatible with various applications, such as single-photon-counting LiDAR and other applications that rely on highly-sensitive detectors. Each pulsed fiber laser-based architecture is designed to preserve the all-fiber nature of pulsed fiber lasers, thereby supporting their use in compact, rugged, or other optical sensing transceivers. For example, pulsed fiber laser-based architectures can be used in optical sensing transceivers deployed in harsh field conditions. The pulsed fiber laser-based architectures are also designed to achieve high electric-to-optic efficiencies and to support arbitrary pulse formats, such as operation at high pulse repetition frequencies and high average optical powers. In addition, the pulsed fiber laser-based architectures can be designed to operate at wavelengths compatible with proven high-performance receiver technologies used in optical sensing transceivers and to exhibit good optical transmissions through the atmosphere or other transmission media.

FIG. 1 illustrates a first example high-pulse-contrast fiber laser transmitter 100 according to this disclosure. As shown in FIG. 1, the fiber laser transmitter 100 includes a signal seeder, which in this example includes a master oscillator 102, an amplitude modulator 104, a time gate 106, and a phase modulator 108. The master oscillator 102 generally operates to produce an initial optical signal, which may be used to produce a seed signal 110 that is then amplified. The master oscillator 102 includes any suitable structure configured to generate an optical signal, such as one or more laser diodes or other laser source. In some embodiments, the master oscillator 102 may include a single-longitudinal-mode laser source. In particular embodiments, the master oscillator 102 may include a fiber-coupled distributed-feedback or distributed Bragg reflector semiconductor laser. In other embodiments, the master oscillator 102 may include a fiber-coupled semiconductor laser equipped with an external cavity having a dispersive element, such as a volume Bragg grating. The seed signal 110 may have any desired wavelength or wavelengths, such as when the master oscillator 102 emits light at a chosen wavelength that is within a spectral window allowing for good atmospheric transmission and that is compatible with high-performance optical receivers.

The amplitude modulator 104 generally operates to alter the amplitude of the optical signal emitted by the master oscillator 102, thereby helping to form distinct pulses in the optical signal. The amplitude modulator 104 includes any suitable structure configured to controllably alter the amplitude of an optical signal. In some embodiments, the amplitude modulator 104 may include a Mach-Zehnder interferometer embedded in an electro-optically active crystal, such as a fiber-coupled lithium-niobate modulator. In other embodiments, the amplitude modulator 104 may include one or more fiber-coupled electro-absorptive devices, such as one featuring a semiconductor chip that exhibits optical absorption that is voltage-controlled via the Franz-Keldysh effect. In still other embodiments, the amplitude modulator 104 may include one or more current-controlled fiber-coupled semiconductor optical amplifiers operated as one or more time-gating devices. Note that while a single amplitude modulator 104 is shown in FIG. 1, multiple amplitude modulators 104 may be used in series in order to meet specific pulse format requirements, pulse repetition frequencies, pulse durations, pulse temporal profiles/shapes, on/off extinctions, or other specifications. In some embodiments, the amplitude modulator 104 or the set of amplitude modulators 104 can generate sequences of short optical pulses, such as pulses having a one to several nanosecond duration or picosecond duration, at pulse repetition frequencies of a few kilohertz up to tens of megahertz or higher.

The time gate 106 generally operates as an amplitude modulator to selectively block or not block an optical signal. The time gate 106 includes any suitable structure configured to selectively pass or block an optical signal. In some embodiments, the time gate 106 may represent a pulsed semiconductor optical amplifier (SOA) that can provide optical gain to offset the insertion loss of the amplitude modulator 104.

The phase modulator 108 may optionally be used to adjust the phase of the seed signal 110. For example, the phase modulator 108 may be used to deliberately broaden and shape the signal spectrum of the seed signal 110. Among other things, this may help to inhibit the onset of unwanted nonlinear optical effects (NLOEs) in a fiber, such as stimulated Brillouin scattering or four-wave mixing. In other embodiments, the phase modulator 108 can be driven to impart optical phase patterns in order to encode one or more data streams onto the seed signal 110. The phase modulator 108 includes any suitable structure configured to modulate the phase of an optical signal.

In this example, the amplitude modulator 104 and the time gate 106 are controlled using an electronic pulse driver 112. The electronic pulse driver 112 is configured to generate electrical pulses in control signals provided to the amplitude modulator 104 and the time gate 106, where the electrical pulses control the operation of the amplitude modulator 104 and the time gate 106. The electronic pulse driver 112 includes any suitable structure configured to generate control signals used for amplitude modulation and time gate control, such as an arbitrary waveform generator. In some embodiments, the electronic pulse driver 112 may include a digital synthesizer, a broadband digital-to-analog converter, a radio frequency (RF) amplifier, or a voltage-controlled pulsed current source.

The seed signal 110 is provided to an optical filter and isolator block 114. The effective management of amplified spontaneous emissions can be useful in obtaining high optical pulse contrast. The amplified spontaneous emissions produced in rare-earth-doped optical fibers can be spectrally broad and, in some cases, encompasses most of the fiber's optical gain spectrum. Thus, a large majority of the amplified spontaneous emissions can be rejected using a bandpass filter or other spectrally selective fiber-coupled component, which limits the frequencies/wavelengths of optical energy passing through the block 114 to a narrow spectral window (such as to within one or several nanometers of the master oscillator's wavelength) and helps to control amplified spontaneous emissions or other unwanted frequencies from propagating through the laser transmitter 100. The optical isolator helps to prevent back-propagation of optical energy in the laser transmitter 100, such as backward-propagating ASE, back-reflections, Rayleigh scattering, stimulated Brillouin scattering, and residual unabsorbed pump light. The filter portion of the block 114 includes any suitable structure configured to filter unwanted optical frequencies, such as a fiber-coupled optical bandpass filter, a fiber-Bragg grating, or a fiber-coupled etalon filter. The isolator portion of the block 114 includes any suitable structure configured to limit the flow of optical energy to a desired direction, such as a Faraday optical isolator.

The filtered and isolated seed signal 110 is used as the input to a series 116 of N preamplifier-filter/isolator units, where each unit includes a fiber-based optical preamplifier 118 and an optical filter and isolator block 120. Each optical preamplifier 118 is configured to receive an input optical signal and generate an amplified optical signal 122. Each optical filter and isolator block 120 is configured to filter the amplified optical signal 122 and reduce back-propagation of optical energy through the laser transmitter 100. Each optical preamplifier 118 includes any suitable fiber-based structure configured to perform optical amplification, such as a rare-earth-doped fiber amplifier. In some embodiments, each optical preamplifier 118 may represent a ytterbium (Yb)-doped fiber amplifier configured to amplify wavelengths in the range of about 1.0 microns to about 1.1 microns, an erbium (Er)-doped fiber amplifier configured amplify wavelengths in the range of about 1.5 microns to about 1.6 microns, or a thulium (Tm)-doped fiber amplifier configured amplify wavelengths in the range of about 1.9 microns to about 2.0 microns. Each optical filter and isolator block 120 may be the same as, or similar to, the optical filter and isolator block 114 described above. The design of the series 116 can be tailored to achieve desired characteristics, such as limiting the build-up of ASE noise, mitigating unwanted non-linear optical effects, or maximizing electric-to-optic efficiency (while maintaining an all-fiber-based layout). In other embodiments, each of one or more of the optical preamplifiers 118 may use a gain medium other than a rare-earth-doped fiber, such as an electrically-pumped fiber-coupled semiconductor or fiber-coupled diode-pumped micro-chip, bulk, or wave-guided crystal amplifier, as well as other optical amplifiers that are non-fiber-optic in nature.

Each of the optical preamplifiers 118 may be coupled to a diode laser or other source 124 of optical power using a coupler 126. In some embodiments, each coupler 126 may be formed using a tapered fiber bundle designed for cladding pumping of the rare-earth-doped fiber forming the associated optical preamplifier 118. The tapered fiber bundle can include one or more multi-transverse-mode fibers, which may be side-fused to a central single-transverse-mode fiber. The one or more multi-transverse-mode fibers can be used to guide pumplight from a multi-transverse-mode diode laser or other source 124, and the central single-transverse-mode fiber may be used to guide signal light. The tapered fiber bundle may be fusion-spliced at the input (forward pumping) end and/or the output (backward pumping) end of at least one rare-earth-doped preamplifier fiber. In some cases, for each preamplifier 118, the source 124 that provides pumplight to the optical preamplifier 118 may represent a multi-transverse-mode laser diode operating at about 915 nanometers to about 920 nanometers, about 940 nanometers, or about 975 nanometers to about 980 nanometers (for Yb-doped or Er-doped fiber preamplifiers 118) or about 780 nanometers to about 790 nanometers (for Tm-doped fiber preamplifiers 118). In other cases, for each preamplifier 118, a preamplifier fiber can be optically pumped by a secondary fiber-based laser source 124 operating at about 1010 nanometers to about 1020 nanometers (for a Yb-doped preamplifier fiber), about 1450 nanometers to about 1480 nanometers (for an Er-doped preamplifier fiber), or about 1550 nanometers to about 1570 nanometers (for a Tm-doped preamplifier fiber). In other embodiments, the coupler 126 may include a single-transverse-mode signal/pump multiplexer designed for core pumping of the rare-earth-doped preamplifier fiber and intended for use with single-transverse-mode fiber-coupled pump diode lasers (operating at the wavelengths specified above) or other fiber-coupled sources 124 operating at different wavelengths.

A final fiber-based optical amplifier 128 is generally used to amplify an optical signal and is often referred to as a "power amplifier." The optical amplifier 128 includes any suitable fiber-based structure configured to perform optical amplification, such as a rare-earth-doped fiber amplifier like a Yb-doped, Er-doped, or Tm-doped fiber amplifier. In some embodiments, the optical amplifier 128 includes a specialty rare-earth-doped fiber of larger core-area (compared to the optical preamplifiers 118) in order to support the generation of pulses of greater energy and peak power without incurring unwanted parasitic nonlinear optical effects. Also, in some embodiments, the optical amplifier 128 may emit a Gaussian-like output beam of a predominantly fundamental-transverse-mode nature. This may be necessary or desirable, for example, in order to achieve good spatial beam quality (BQ) as well as stable far-field pointing. Fiber designs supporting fundamental-transverse-mode, good-beam quality operation using relatively large cores include large-mode area fibers (such as those implementing bend-loss mode filtering), photonic crystal fibers, linearly-tapered fibers, and various types of self-spatial-filtering fibers (such as fibers having special cross-sectional geometries and chirally-coupled-core fibers). The fiber of the optical amplifier 128 can be optically pumped by a source 130, which in some cases may be one of the same types of sources 124 listed above for the optical preamplifiers 118.

In this example embodiment, the optical amplifier 128 is terminated by an output beam-expanding endcap 132, which can be used to expand the amplified optical signal from the optical amplifier 128 in order to produce an output optical signal 134. The endcap 132 includes any suitable structure configured to expand an optical beam, such as an endcap that is spliced onto or otherwise connected to the fiber forming the optical amplifier 128. In some embodiments, the endcap 132 may include a glass cylinder having a length of several millimeters, which can be fusion-spliced to the output end of the optical amplifier 128. This type of endcap 132 permits unguided expansion of the beam propagating in the fiber core of the optical amplifier 128 prior to exiting the fiber into free space, such as to reduce its irradiance to a safe value. The endcap 132 may often be angle-polished and/or anti-reflection coated to prevent Fresnel reflections off the glass/air interface from propagating back into the fiber core. In some cases, the optical amplifier 128 may be fusion-spliced or otherwise coupled to a non-rare-earth-doped delivery fiber (such as to ease packaging), in which case the endcap 132 can be coupled to the exit facet of the delivery fiber.

Without anything more, the optical pulse contrast OPC of the laser transmitter 100 can be expressed as:

$$OPC = \frac{E_p}{E_{bkg}} \tag{1}$$

Here, $E_p$ represents the output pulse energy in the output optical signal 134, and $E_{bkg}$ represents the energy temporally emitted between pulses in the output optical signal 134 and spectrally lying within the transmission window of the inter-stage filters (which is referred to as "background energy").

The output pulse energy $E_p$ of the output optical signal 134 can be expressed as:

$$E_p = \int_0^\tau P(t) dt \tag{2}$$

where t represents time (and t=0 is chosen to coincide with the leading edge of an output pulse in the output optical signal 134), $\tau$ represents the effective pulse width of the output pulse, and P(t) represents the emitted power of the output signal 134 at time t. For the architecture of FIG. 1, the emitted power P(t) can be expressed as:

$$P(t) = G_1 \ldots G_N G_p \beta^N \beta_{on} P_{MO} f(t) \tag{3}$$

where $G_i$ represents the optical power gain of the $i^{th}$ preamplifier 118 (where i=1, . . . , N), $G_p$ represents the optical power gain of the optical amplifier 128, $\beta$ represents the optical power transmission of each inter-stage optical filter and isolator block 114 and 120, $\alpha_{on}$ represents the cumulative optical power transmission of the amplitude modulator 104 and the time gate 106 while in their "on" state (the time interval between t=0 and t=$\tau$), $P_{MO}$ represents the continuous-wave (CW) power emitted by the master oscillator 102, and f(t) represents the peak-normalized output-pulse temporal profile of the output signal 134 at time t.

The background energy $E_{bkg}$ associated with the laser transmitter 100 can be expressed as:

$$E_{bkg} = \int_\tau^{\tau + \frac{1}{PRF}} P(t) dt = E_{leak} + E_{ASE} \tag{4}$$

Here, $E_{leak}$ represents the contribution to background energy due to optical energy from the master oscillator 102 leaking through the amplitude modulator 104 and the time gate 106 in their non-transmitting (off) state and then being amplified. Also, $E_{ASE}$ represents the contribution to background energy due to in-band ASE in the optical preamplifiers 118 and the optical amplifier 128. These can be expressed as:

$$E_{leak} = \int_{\tau}^{\tau + \frac{1}{PRF}} G_1 \ldots G_N G_p \alpha_{off} \beta^N P_{MO} dt \quad (5)$$

$$E_{ASE} = \int_{\tau}^{\tau + \frac{1}{PRF}} G_1 \ldots G_N G_p$$

$$\beta^N \rho_0 \Delta\lambda \left(1 + \frac{1}{\beta G_1} + \frac{1}{\beta^2 G_1 G_2} + \ldots + \frac{1}{G_1 \ldots G_3}\right) dt \quad (6)$$

Here, $\Delta\lambda$ represents the pass-bandwidth of the filters used in the laser transmitter 100. Also, $\rho_0$ represents the spontaneous emission spectral power density, which can be given by:

$$\rho_0 = 2m\frac{hc^2}{\lambda^3} \quad (7)$$

where h is Planck's constant, c is the speed of light in a vacuum, $\lambda$ is the wavelength, and m is the number of transverse modes guided by the fiber (note that m is often equal to one in typical pulsed fiber lasers used in optical sensing transceivers).

Equations (5) and (6) can be simplified to yield:

$$E_{bkg} \sim \frac{\beta^N G_1 \ldots G_N G_p}{PRF}(\alpha_{off} P_{MO} + \rho_0 \Delta\lambda) \quad (8)$$

To arrive at Equation (8), assume that $\beta G_1 \gg 1$, which means that the contribution to ASE power due to amplification of spontaneous emissions of the first preamplifier 118 through the entire series 116 dominates over the ASE originating in successive preamplifiers 118. In other words, the ASE from the first preamplifier 118 is amplified more by the series 116 than the ASE from the subsequent preamplifiers 118. This is a condition that is met in many practically-relevant pulsed fiber laser architectures.

From Equations (2) and (8), it is possible to define the optical pulse contrast OPC as:

$$OPC = \frac{\alpha_{on} P_{MO} \mathcal{A}}{\frac{\alpha_{off} P_{MO} + \rho_0 \Delta\lambda}{PRF}} \quad (9)$$

Here, $\mathcal{A}$ represents the area under the peak-normalized output-pulse temporal profile of the output signal 134. Note that the optical-power gain of the preamplifier series 116 does not appear in Equation (9) because the background energy experiences the same amplification as the main output pulses. In the simple and significant case of a "flat-top" pulse temporal profile, Equation (9) can be further simplified as:

$$OPC = \frac{\alpha_{on} P_{MO} \delta}{\alpha_{off} P_{MO} + \rho_0 \Delta\lambda} \quad (10)$$

where $\delta = \tau \times PRF$ represents the pulse duty cycle (and where PRF represents the pulse repetition frequency).

Figure 2:
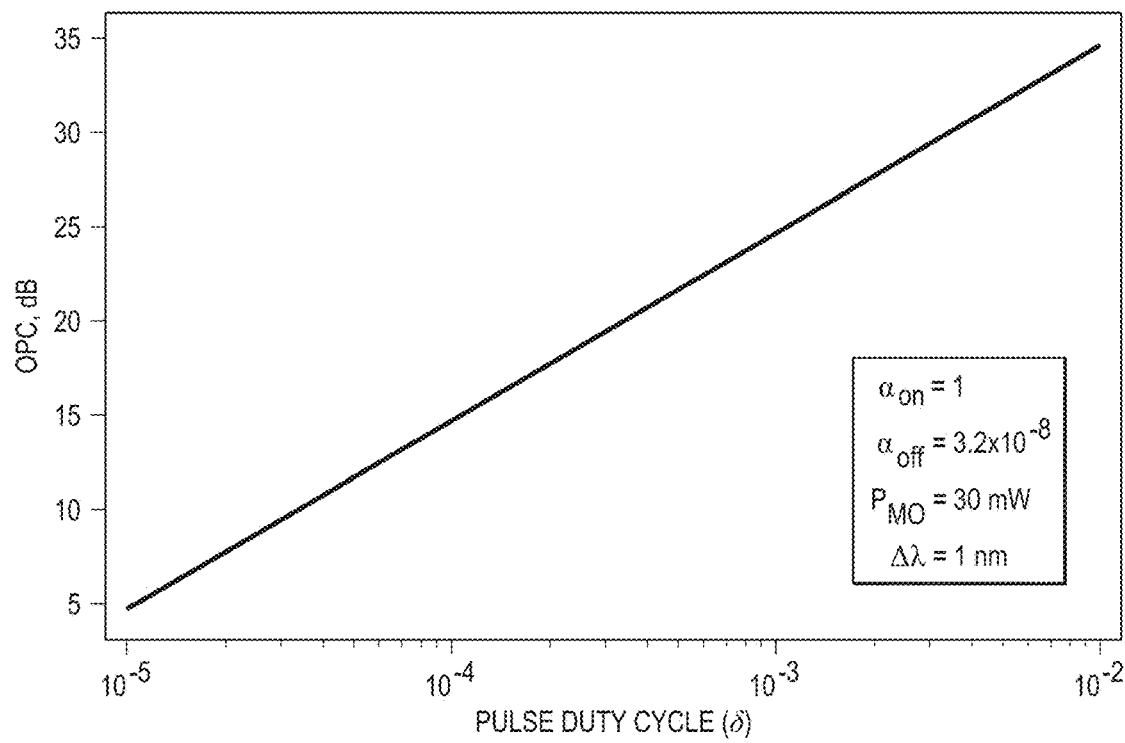
FIG. 2 illustrates an example graph plotting optical pulse contrast values against pulse duty cycle values according to this disclosure.

FIG. 2 illustrates an example graph 200 plotting optical pulse contrast (OPC) values against pulse duty cycle ($\delta$) values according to this disclosure. In this example, realistic values are selected for the parameters of Equation (10). This includes $\alpha_{on}=1$, which applies when the time gate 106 is a pulsed SOA, for example. This also includes $\alpha_{off}=3.2\times10^{-8}$, which corresponds to an approximately 75-decibel cumulative on/off power extinction characteristic provided by an off-the-shelf single-stage Mach-Zehnder modulator used as the amplitude modulator 104 followed by an SOA used as the time gate 106 (about 50-decibel extinction). This further includes $P_{MO}=30$ milliwatts, which is typical of commercially-available fiber-coupled distributed-feedback, optically isolated diode laser master oscillators. In addition, this includes $\Delta\lambda=1$ nanometer, which is a typical performance of narrow bandpass filters used in LiDAR applications, for instance. Once these parameter values are used in Equation (10), the two terms in the denominator take on significantly different values.

For pulse duty cycles typical of many practical optical sensing transceivers (such as $\delta=10^{-4}$, which may correspond to $\tau=1$ nanosecond and PRF=100 kilohertz), it can be inferred from FIG. 2 that the optical pulse contrast remains relatively low (such as less than about 20 decibels) compared to the requirements for demanding applications. For example, in single-photon-counting LiDAR applications, there may be a requirement that the optical pulse contrast be low enough such that the spurious photon count rate (BCR) caused by background light emitted between pulses is lower than the characteristic dark-count rate (DCR) of the receiver being used. This can be expressed as:

$$BCR < DCR \quad (11)$$

Example values of DCR for existing photon-counting detectors (such as Geiger-mode avalanche photodiodes) lie in a range of about 1 kilohertz to about 10 kilohertz. The BCR can be expressed as:

$$BCR = n_{bkg} \times PRF = \frac{\eta E_{bkg}}{Q\varepsilon} \times PRF \quad (12)$$

Here, $n_{bkg}$ represents the number of background photons detected, $\eta$ represents the receiver quantum efficiency (the probability of recording a count after receiving a photon), Q represents the optical isolation between the transmitter and receiver optical paths, and $\varepsilon = hc/\lambda$ represents the photon energy.

By substituting Equation (1) into Equation (12), the following can be obtained:

$$BCR = \frac{\eta E_p}{Q\varepsilon} \times \frac{PRF}{OPC} \quad (13)$$

When combined with Equation (11), this yields an OPC specification of:

$$OPC > \frac{\eta P_{avg}}{Q\varepsilon} \times \frac{1}{DCR} \quad (14)$$

Here, $P_{avg} = E_p \times PRF$ and represents the output average power of the output signal 134.

Figure 3:
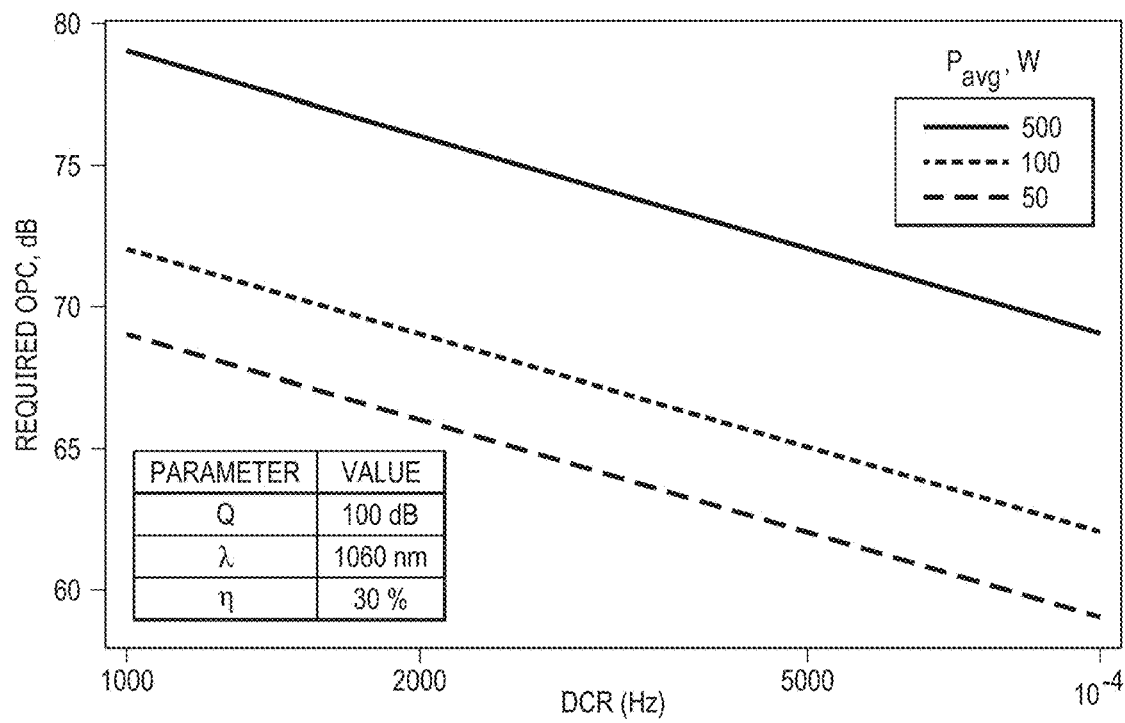
FIG. 3 illustrates an example graph quantifying optical pulse contrast values for a specific single-photon-counting application according to this disclosure.

FIG. 3 illustrates an example graph 300 quantifying optical pulse contrast (OPC) values for a specific single-photon-counting application according to this disclosure. More specifically, the graph 300 quantifies OPC values for a single-photon-counting LiDAR application. Based on the graph 300, this particular application may need the optical pulse contrast value to be greater than 60 decibels (which is about three orders of magnitude higher than that calculated in FIG. 2) for practical values of Q (typically about 100 decibels). If this condition cannot be met, optical sensing transceiver architects may be forced into designs providing higher values of Q, which may require additional time gates (possibly bulk time gates), baffled/shrouded components to minimize stray light and scatter, and/or optical layouts where the transmitting and receiving optical paths are physically separated (such as in bi-static optical sensing transceivers). In many practical optical sensing transceivers, these design solutions might be applicable only in part or not at all since they usually clash with other functional requirements and/or increase the OST complexity and its size, weight, and power consumption.

In order to achieve an improved optical pulse contrast in the laser transmitter 100, the laser transmitter 100 includes a seeded Raman fiber amplifier 136 (also referred to as a "Raman fiber shifter") and a seeder source 138 for the Raman fiber amplifier 136. The laser transmitter 100 may also include an additional optical filter and isolator block 140 optically positioned between the Raman fiber amplifier 136 and the optical amplifier 128. The Raman fiber amplifier 136 generally operates to amplify, using Raman amplification, the optical signal that is generated by the final preamplifier 118 and filtered by the final optical filter and isolator block 120. The optical power for the Raman amplification is provided by the seeder source 138.

The Raman fiber amplifier 136 includes any suitable fiber-based structure configured to perform Raman amplification. In some embodiments, the Raman fiber amplifier 136 includes a piece of optical fiber having an appropriate length and core diameter, where the guiding core contains a Raman-active material. In this type of fiber amplifier 136, an injected pump beam from the seeder source 138 undergoes inelastic scattering, as a fraction of its photon energy is spent into exciting matter vibrations (also referred to as "optical phonons"), so that the beam photons emerge frequency-shifted by a material-specific amount $\delta_v$ (referred to as a "Stokes shift"). Examples of Raman-active materials that may be used in the fiber core of the Raman fiber amplifier 136 may include pure fused-silica itself, as well germanium-, aluminum-, and/or phosphorous-doped silica. Different materials exhibit different Raman-scattering cross-sections and therefore have different Raman gain coefficients $g_R$. The seeder source 138 represents any suitable source of optical power for Raman amplification, such as one or more laser diodes. The optical filter and isolator block 140 may be the same as, or similar to, the optical filter and isolator block 114 described above.

Figure 4:
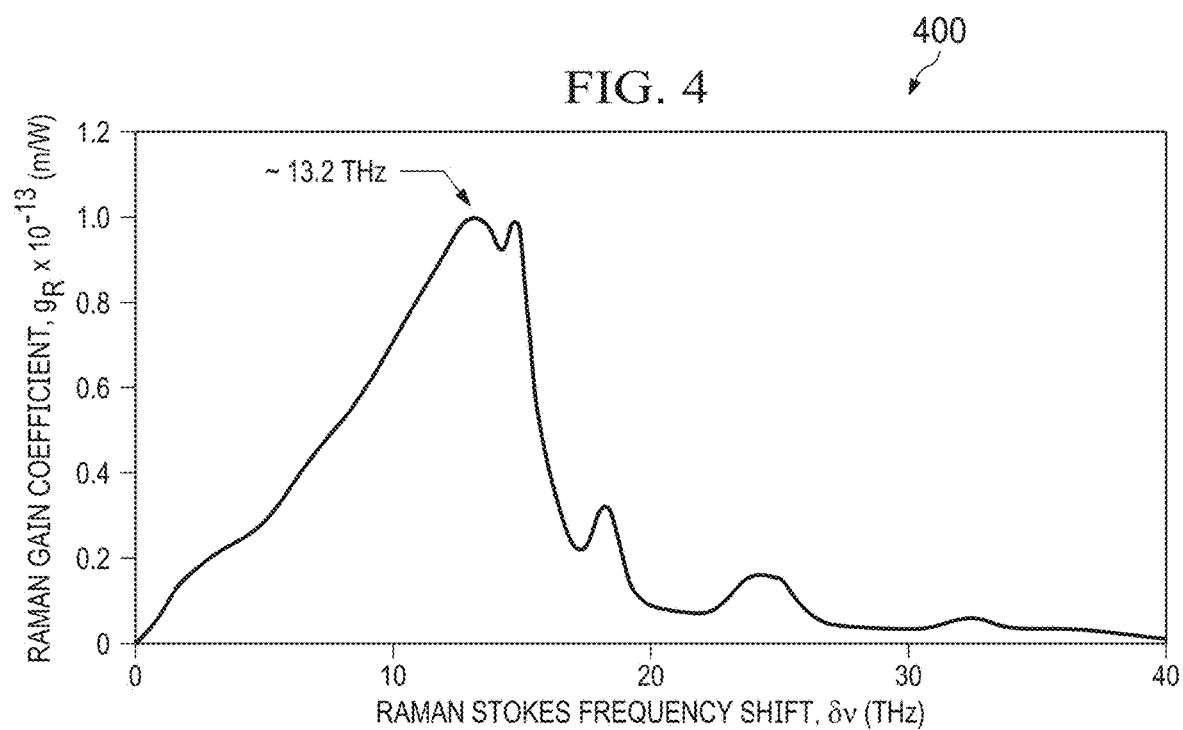
FIG. 4 illustrates an example graph showing a spectral distribution for Raman gain coefficients in a typical fused-silica-core fiber according to this disclosure.
Figure 5:
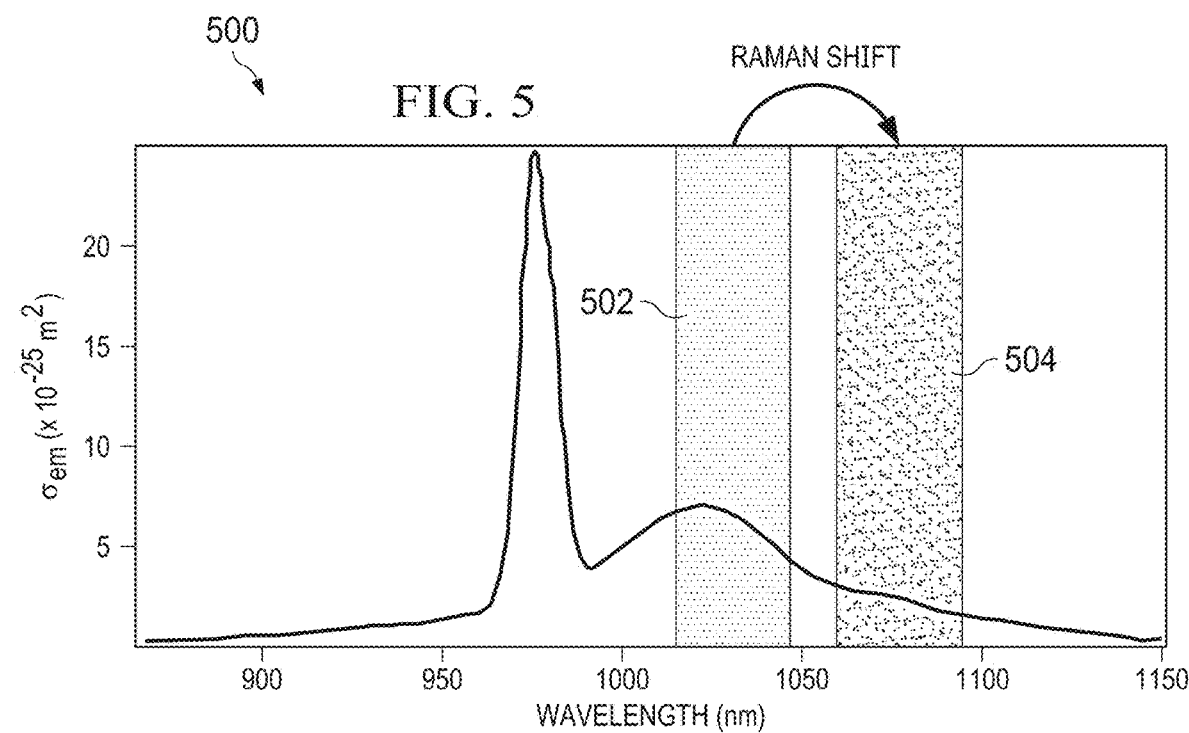
FIG. 5 illustrates an example graph plotting an optical emission cross-section against emission wavelength for a typical fiber according to this disclosure.

The fiber used to form the Raman fiber amplifier 136 can have any suitable operational characteristics. For example, FIG. 4 illustrates an example graph 400 showing a spectral distribution for Raman gain coefficients ($g_R$) in a typical fused-silica-core fiber according to this disclosure. As can be seen in FIG. 4, the peak gain corresponds to a Stokes shift $\delta_v$ of about 13.2 terahertz. As another example, FIG. 5 illustrates an example graph 500 plotting an optical emission cross-section ($\sigma_{em}$) against emission wavelength for a typical fiber according to this disclosure. In particular, the graph 500 plots an optical emission cross-section against emission wavelength for a typical Yb-doped fiber. As can be inferred from FIG. 5, if a Yb-doped Raman fiber amplifier 136 is seeded to operate at a wavelength in a specified range 502 (such as about 1015 nanometers to about 1047 nanometers), each wavelength in this range 502 would be Raman-shifted to a longer wavelength in a corresponding range 504 (such as about 1060.3 nanometers to about 1095 nanometers). This still lies within the Yb emission spectrum. As a result, the Raman-shifted signal from the Raman fiber amplifier 136 can still be amplified by a Yb-doped optical amplifier 128.

This notion is leveraged in the architecture of FIG. 1. Thus, in some embodiments, the master oscillator 102 operates at about 1030 nanometers (or at some other wavelength(s) within the about 1015 nanometer to about 1047 nanometer range), and the seed signal 110 is amplitude-modulated and amplified through the series 116 of preamplifiers 118 (such as Yb-doped fiber amplifiers). The output from the final preamplifier 118 acts as the pump beam for the seeded Raman fiber amplifier 136, and the Raman fiber amplifier 136 Raman-shifts the amplified-beam wavelength (such as from about 1030 nanometers to about 1076.5 nanometers). The seeder source 138 correspondingly emits a Raman seed beam at a matching wavelength, such as about 1076.7 nanometers. In particular embodiments, the Raman pump and seed beams are both injected at the input end of the seeded Raman fiber amplifier 136 in an all-fiber manner, such as by using a spectrally-combining fiber-optic component (like a wavelength-division multiplexer). The Raman-shifted beam that is output from the Raman fiber amplifier 136 (such as at a wavelength of about 1076.5 nanometers) is amplified by the optical amplifier 128 (such as a Yb-doped fiber amplifier). Note that, if needed or desired, the additional optical filter and isolator block 140 may be used to filter the output from the Raman fiber amplifier 136 and to isolate the Raman fiber amplifier 136 from back-propagating optical energy. Also note that the specific wavelengths provided above are for illustration only and that other wavelengths may be used, such as when Er-doped or Tm-doped preamplifiers 118 are used.

The presence of the seeded Raman fiber amplifier 136 between the optical preamplifiers 118 and the optical amplifier 128 helps to improve the optical pulse contrast achieved using the laser transmitter 100. For example, in some cases, the improvement in the optical pulse contrast can be quantified as follows. Note that the following description is for illustration only and that other quantifications or improvements in optical pulse contrast may be achieved using the seeded Raman fiber amplifier 136.

The mechanism through which the seeded Raman fiber amplifier 136 increases the optical pulse contrast rests on the nonlinear nature of the Raman shifting process, the dynamics of which can be described as:

$$\frac{dP}{dz} = -\frac{g_R}{MFA}\frac{\lambda_s}{\lambda}PP_s - \alpha P \tag{15}$$

$$\frac{dP_s}{dz} = \frac{g_R}{MFA}PP_s - \frac{g_R}{MFA}\frac{\lambda_{s2}}{\lambda_s}P_s P_{s2} - \alpha P_s \tag{16}$$

Here, z represents the spatial coordinate along the length of the Raman fiber amplifier 136, and P represents the Raman pump optical power (namely the power of the beam emitted by the master oscillator 102, amplified through the series 116 of optical preamplifiers 118, and propagating through the Raman fiber amplifier 136). In the above example where the master oscillator 102 operates at about 1030 nanometers and the preamplifiers 118 and optical amplifier 128 are Yb-doped fiber amplifiers, the value of P can represent the optical power at about 1030 nanometers. Also, MFA represents the mode-field area, meaning the cross-sectional area of fields propagating in the fundamental transverse mode of the Raman fiber amplifier 136. Further, λ represents the pump wavelength (such as about 1030 nanometers), and $\lambda_s$ represents the corresponding Raman-shifted wavelength (such as about 1076.7 nanometers). In addition, $P_s$ represents the Raman-shifted beam optical power, α represents the propagation loss coefficient characterizing the core of the Raman fiber amplifier 136, $\lambda_{s2}$ represents the wavelength obtained after two Raman shifts (meaning the second-order Stokes shift), and $P_{s2}$ represents the power in the corresponding second-order Stokes-shifted beam.

Two approximations, acceptable in practical applications, have been made in order to obtain the simple form of Equations (15)-(17), namely the relatively-weak wavelength dependences of the MFA and α parameters have been neglected as have been group-velocity dispersion effects, which is appropriate in the nanosecond-pulse regime typical of optical sensing transceivers. Moreover, these equations are "terminated" at the second-order Stokes shift because, in practically-relevant architectures, the optical intensity within and length of the Raman fiber amplifier 136 are chosen to be insufficient to generate higher-order Stokes shifts.

Equations (15)-(17) can readily be solved, such as via numeric integration with the following initial conditions (where z=0 denotes the input end of the Raman fiber amplifier 136):

$$P(z=0) = P_{on} \text{ for } 0 < t < \tau \qquad (18)$$

$$P(z=0) = P_{off} \text{ for } \tau < t < 1/PRF \qquad (19)$$

$$P_s(z=0) = P_{s0} \qquad (20)$$

$$P_{s2}(z=0) \sim P_{sp,\lambda_{s2}} \qquad (21)$$

Here, $P_{on}$ represents the pulse power prior to being amplified in the optical amplifier 128. From Equation (3), the value of $P_{on}$ can be derived as:

$$P_{on} = G_1 \ldots G_N \beta^N \alpha_{on} P_{MO} = \frac{P}{G_p} \qquad (22)$$

where P is the output pulse power in the output optical signal 134 with the simplifying assumption of a "flat-top" pulse temporal profile being retained. In Equation (19), $P_{off}$ represents the background power (the power between pulses) prior to amplification through the optical amplifier 128. From the expression of $E_{bkg}$ given in Equation (8), the value of $P_{off}$ can be derived as:

$$P_{off} = G_1 \ldots G_N \beta^N (\alpha_{off} P_{MO} + \rho_0 \Delta\lambda) = \frac{P}{G_p} \left( \frac{\alpha_{off}}{\alpha_{on}} + \frac{\rho_0(\lambda)\Delta\lambda}{\alpha_{on} P_{MO}} \right) \qquad (23)$$

Moreover, $P_{s0}$ represents the seed power injected into the Raman fiber amplifier 136 at the first-order Stokes wavelength $\lambda_s$. It is assumed here that the seeder source 138 emits pulses of power $P_{R\text{-}seed}$ at wavelength $\lambda_s$ having the same temporal profile as the pulses in the input to the Raman fiber amplifier 136 and time-synchronized with them such that $P_{s0} = P_{R\text{-}seed}$ during the time interval $0 < t < \tau$ (during a pulse). Between pulses, the value of $P_{s0}$ can be obtained by summing two contributions as follows:

$$P_{s0} = \tilde{\alpha}_{off} P_{R\text{-}seed} + P_{sp,\lambda_s} \qquad (24)$$

Here, the first term in the right-hand side of Equation (24) represents power emitted by the seeder source 138 between pulses, meaning "leak" power ($\tilde{\alpha}_{off}$ is the Raman seeder's optical power transmission coefficient between pulses). The second term in the right-hand side of Equation (24) represents the power of spectrally-broadband spontaneous Raman scattering centered at wavelength $\lambda_s$ and can be given by:

$$P_{sp,\lambda_s} \sim \frac{hc}{\lambda_s} \Delta\nu \qquad (25)$$

where Δν represents the approximate width of the main peak of the Raman gain distribution, such as about 10 terahertz. In architectures like the one shown in FIG. 1, Δν can be replaced by the pass bandwidth (typically about 1 nanometer, which corresponds to about 260 gigahertz for a wavelength $\lambda_s$ of about 1076.5 nanometers) of the fiber-coupled filter in the optical filter and isolator block 140 located at the output end of the Raman fiber amplifier 136. Finally, the value of $P_{s2}$ (z=0) in Equation (21) corresponds to the spontaneous Raman scattering power $P_{sp,\lambda_{s2}} \sim (hc/\lambda_{s2})\Delta\nu$ in the Raman fiber amplifier 136.

Figure 6:
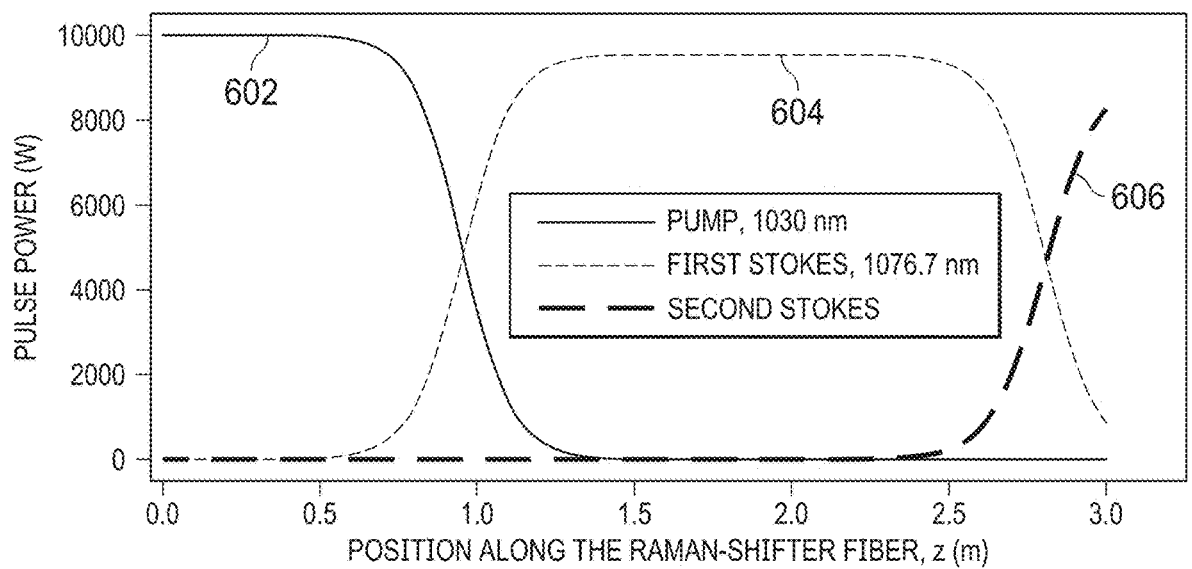
FIG. 6 illustrates an example graph plotting pulse power against position along a seeded Raman fiber amplifier during a pulse according to this disclosure.

FIG. 6 illustrates an example graph 600 plotting pulse power against position along a seeded Raman fiber amplifier 136 during a pulse according to this disclosure. More specifically, FIG. 6 illustrate a numerical solution for Equations (15)-(17) in terms of pulse power (for pump, first-order Stokes shift, and second-order Stokes shift beams) versus position (z) along the Raman fiber amplifier 136 as calculated during a pulse (meaning during the time interval $0 < t < \tau$). In FIG. 6, a line 602 represents the pump power of the Raman fiber amplifier 136, such as the pump power at about 1030 nanometers for a Raman-seed pulse power of about 30 milliwatts at about 1076.5 nanometers. A line 604 represents the Raman-shifted beam power after a first-order Stokes shift, meaning at about 1076.5 nanometers for the Raman-seed pulse power of about 30 milliwatts. A line 606 represents the Raman-shifted beam power after a second-order Stokes shift, meaning at about 1127.6 nanometers for a Raman-seed pulse power of about 30 milliwatts at about 1076.5 nanometers and no seed power at about 1127.6 nanometers.

In this example, the seeder source 138 may be assumed to be a fiber-coupled single-frequency diode laser operating at about 1076.5 nanometers and may be assumed to be externally amplitude-modulated in a manner similar to the master oscillator 102 to yield pulses of the same duration as and synchronized with the pump pulses. Also, both Raman pump and seeder pulses are assumed to have a flat-top power profile with negligible rise and fall times. The first-order Stokes Raman seed power $P_{s0}$ is assumed to be about 30 milliwatts (substantially equal to $P_{MO}$) during the pulse. Other parameter values used to obtain the graph 600 are shown below in Table 1.

TABLE 1

Numerical values of parameters used in simulation illustrated in FIG. 6

| Parameter | Value |
| --- | --- |
| Pulse power prior to Raman shifting (Raman pump power), $P_{on}$ | 10 kW |
| Pump-beam wavelength, λ | 1030 nm |
| Mode-field area, MFA | 7.85 × 10$^{-11}$ m$^2$ |

TABLE 1-continued

Numerical values of parameters used
in simulation illustrated in FIG. 6

| Parameter | Value |
|---|---|
| Master Oscillator power | 30 mW |
| Modulator/time-gate transmission coefficient pulse, $\alpha_{on}$ | 1 |
| Modulator/time-gate transmission coefficient between pulses, $\alpha_{off}$ | $3.2 \times 10^{-8}$ |
| Bandpass filtering pass-bandwidth, $\Delta\lambda$ | 1 nm |
| Raman gain coefficient, $g_R$ | $10^{-13}$ m/W |
| $1^{st}$ Stokes beam wavelength, $\lambda_s$ | 1076.5 nm |
| $2^{nd}$ Stokes beam wavelength, $\lambda_{s2}$ | 1127.6 nm |
| Propagation loss coefficient, $\alpha$ | 1 dB/km |
| $1^{st}$ Stokes seeder-source power, $P_{R\text{-}seed}$ | 30 mW |
| Raman seeder-source transmission coefficient between pulses, $\alpha_{off}$ | $3.2 \times 10^{-8}$ |

As can be seen in FIG. 6, effective Raman shifting may involve a relatively short Raman fiber amplifier 136, such as one that is less than about two meters. Based on this, the optical pulse contrast for a beam that exits the Raman fiber amplifier 136, traverses the optical filter and isolator block 140 (which may have a pass bandwidth $\Delta\lambda$ of about one nanometer), and is amplified by the optical amplifier 128 can be given by:

$$OPC = \frac{P_{s,on}}{P_{s,off} + \rho_0(\lambda_s)\Delta\lambda}\delta \quad (26)$$

Here, $P_{s,on}$ and $P_{s,off}$ represent power through the optical filter and isolator block 140 during and between pulses, respectively. In the above example, the values for $P_{s,on}$ and $P_{s,off}$ can be obtained as the output of the numerical simulation, where $P_{s,on}$ is about equal to 9.55 kilowatts and $P_{s,off}$ is about equal to $4.8 \times 10^{-8}$ watts.

Figure 7:
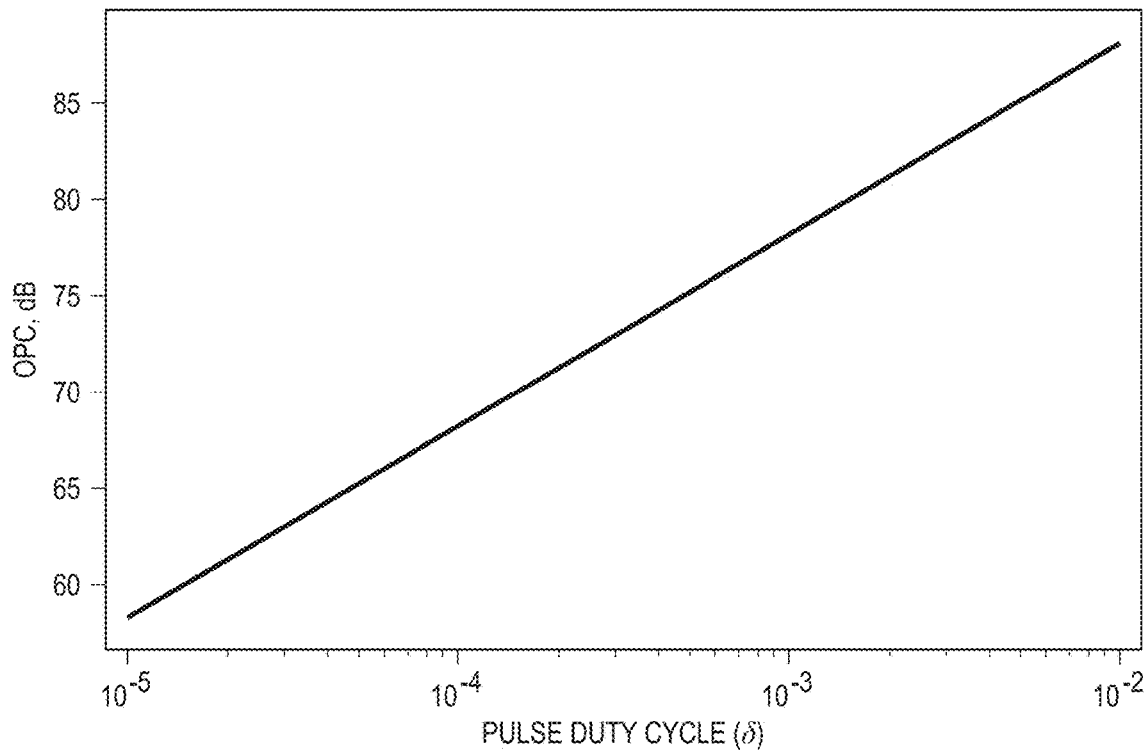
FIG. 7 illustrates an example graph plotting optical pulse contrast values against pulse duty cycle values using the high-pulse-contrast fiber laser transmitter of FIG. 1 according to this disclosure.

FIG. 7 illustrates an example graph 700 plotting optical pulse contrast (OPC) values against pulse duty cycle ($\delta$) values using the high-pulse-contrast fiber laser transmitter 100 of FIG. 1 according to this disclosure. Here, the graph 700 plots the OPC values obtained using Equation (26) against the pulse duty cycle values. Compared to the graph 200 of FIG. 2, it can be seen that inserting the seeded Raman fiber amplifier 136 into the laser transmitter 100 increases the optical pulse contrast values by over 50 decibels, which can (depending on the implementation) align the performance of the laser transmitter 100 with the requirements of advanced optical sensing transceivers.

Note that the increased optical pulse contrast values here come at the expense of some optical loss incurred in the Raman fiber amplifier 136. Such loss can be ascribed to quantum defects and in-fiber non-radiative processes. The quantum defect loss, which is strictly related to the difference in photon energy between the pump and first-order Stokes beams, is fully accounted for in Equations (15)-(17). Through the numerical simulation carried out above, the calculated quantum defect loss is found to be about $$(1 - \frac{P_{s,on}}{P_{on}}) \sim 0.045$$

or about 4.5%. Additional power loss, related to non-radiative processes not modeled here, is typically in the range of 10% to about 20%. However, not all optical loss incurred in the Raman process maps to increased power consumption for the laser transmitter 100. In fact, after the Raman fiber amplifier 136, the beam undergoes power amplification in the optical amplifier 128, which in practically-relevant configurations is operated near-saturation (meaning it is a strongly-seeded relatively low-gain amplifier). In this approach, the output power dependence of the optical amplifier 128 on seed power is sub-linear, which means that part of the Raman-related loss can be offset.

Another feature of the laser transmitter 100 is that it is compatible with applications desiring or requiring high spectral brightness, which is typical of many optical sensing transceiver applications. In fact, for a given pulse peak power, the pulse temporal profile can be used to minimize unwanted spectral broadening caused by nonlinear phase shifts while maintaining the same Raman shifting efficiency. To quantify this, consider two distinct pulse shapes:

$$f_{flat\text{-}top}(t) = \begin{cases} 0 & \text{for} \quad t < -\frac{\tau}{2} - \tau_0 \\ \frac{t + \frac{\tau}{2} + \tau_0}{\tau_0} & \text{for} \quad -\frac{\tau}{2} - \tau_0 < t < -\frac{\tau}{2} \\ 1 & \text{for} \quad -\frac{\tau}{2} < t < \frac{\tau}{2} \\ 1 - \frac{t - \frac{\tau}{2}}{\tau_0} & \text{for} \quad \frac{\tau}{2} < t < \frac{\tau}{2} + \tau_0 \\ 0 & \text{for} \quad t > \frac{\tau}{2} + \tau_0 \end{cases} \quad (27)$$

$$f_{gauss}(t) = \exp\left(-4\ln 2 \frac{t^2}{\tau^2}\right) \quad (28)$$

Equation (27) defines a peak-normalized flat-top pulse temporal profile having a flat portion of duration $\tau$ and linearly-sloped edges with a 0-100% rise/fall time $\tau_0$. Equation (28) defines the functional form of a peak-normalized Gaussian profile of full-width at half-maximum pulse width equal to $\tau$. The nonlinear optical phase shift $\Delta\varphi$ characterizing pulses propagating in a fiber can be expressed as:

$$\Delta\varphi(t) = \frac{2\pi n_2 P_{peak} f(t) L}{\lambda_0 \times MFA} \quad (29)$$

Here, $n_2$ represents the fused-silica nonlinear refractive index coefficient (about $2.5 \times 10^{31\ 20}$ m$^2$/W), $P_{peak}$ represents the pulse peak power, f(t) represents the peak-normalized pulse temporal profile over time, and L represents the fiber length. To obtain Equation (29), it is assumed that the pulse peak power and profile remain constant through the length of the Raman fiber amplifier 136. This is an acceptable approximation for the Raman fiber amplifier 136 if $P_{peak}$ is regarded as the sum of the pump and first-order Stokes pulse powers at each point along the Raman fiber amplifier 136 and is equal to the average of the pump and first-order Stokes wavelengths. The power spectral density $\mathcal{P}(\nu)$ corresponding to Equation (29) can be obtained via Fourier transform and expressed as:

$$\mathcal{P}(\nu) = \left|\int_{-\infty}^{\infty} \sqrt{P_{peak} f(t)} \exp\left[-2\pi i \frac{c}{\lambda_o} t + i\Delta\varphi(t)\right] dt\right|^2 \quad (30)$$

Figure 8:
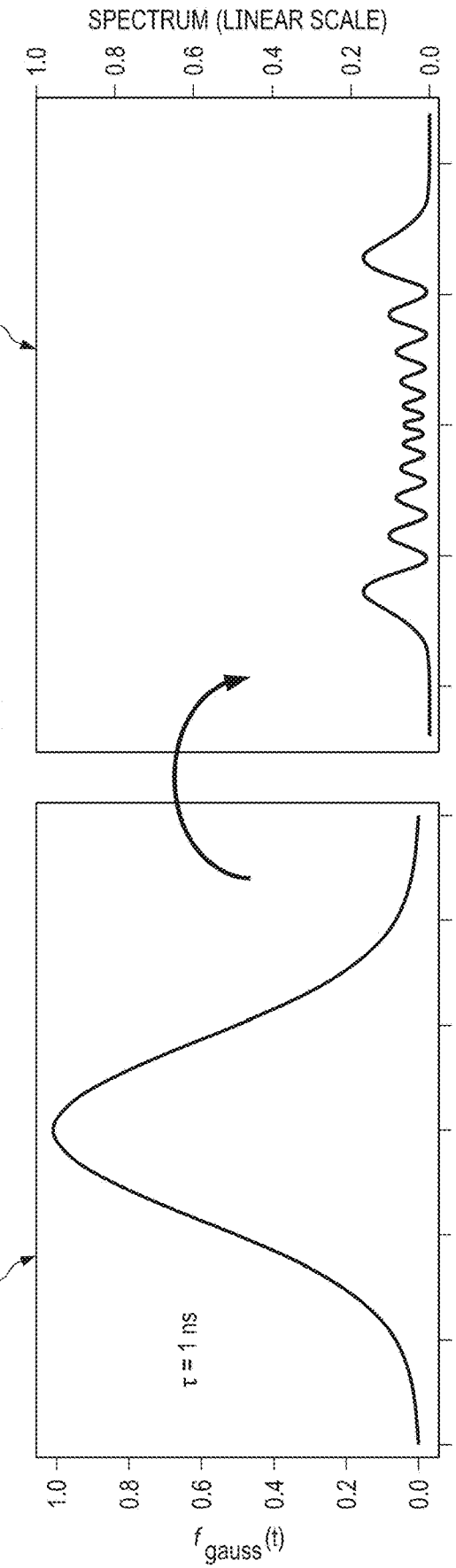
FIG. 8 illustrates example graphs showing different power spectral densities for pulses having different temporal profiles but common peak powers, durations, and wavelengths propagating through the seeded Raman fiber amplifier of FIG. 1 according to this disclosure.
Figure 8:
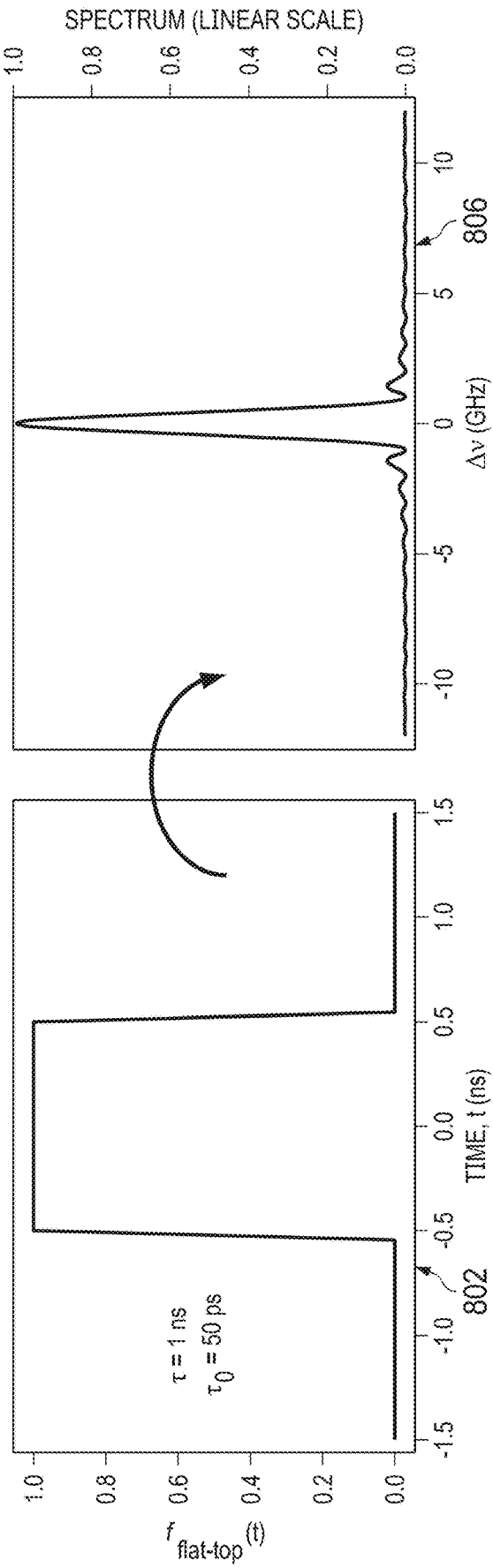

FIG. 8 illustrates example graphs 800, 802 showing different power spectral densities for pulses having different temporal profiles but common peak powers, durations, and wavelengths propagating through the seeded Raman fiber amplifier 136 of FIG. 1 according to this disclosure. More specifically, the pulse profile for the graph 800 is defined by Equation (27), and the pulse profile for the graph 802 is defined by Equation (28). Also, the power spectral densities can be determined as shown in Equation (30) in the presence of nonlinear phase shift. In these examples, the fiber length L is assumed to be 1.75 meters (which is appropriate for the Raman fiber amplifier 136 modeled in FIG. 6), the pulse peak power $P_{peak}$ is assumed to be 10 kilowatts, the mode-field area (MFA) is assumed to be $7.85 \times 10^{-11}$ m$^2$, and the wavelength $\lambda_0$ is assumed to be 1053 nanometers. In the graph 800, the pulse has a Gaussian pulse temporal profile with a full-width at half maximum $\tau$ equal to one nanosecond. In the graph 802, the pulse has a flat-top pulse temporal profile with a width $\tau$ equal to one nanosecond and a rise/fall time $\tau_0$ of 50 picoseconds.

A graph 804 illustrates the power spectral density for the Gaussian pulse profile shown in the graph 800, where the power spectral density is plotted as a function of a frequency difference $\Delta v$ relative to a carrier optical frequency $c/\lambda_0$. A graph 806 illustrates the power spectral density for the flat-top pulse profile shown in the graph 802, where the power spectral density is again plotted as a function of a frequency difference $\Delta v$ relative to a carrier optical frequency $c/\lambda_0$. As can be seen here, the flat-top pulse profile yields a significantly narrower spectrum (higher spectral brightness) compared to the Gaussian pulse profile. The reason for this difference is that the optical frequency variation versus time (chirp) induced by the negligible nonlinear phase shift is proportional to the derivative of the pulse shape and is therefore confined to the steep rising and falling edges of flat-top pulses while significant Raman gain can be achieved. This translates into only a small fraction of the pulse energy being distributed over the spectral side bands.

Note that in much of the description above, it is often assumed that the preamplifiers 118 and the optical amplifier 128 represent Yb-doped fiber amplifiers. However, as noted above, other embodiments may use other types of fiber amplifiers, such as Er-doped or Tm-doped fiber amplifiers. For example, the preamplifiers 118 may be implemented using Tm-doped fiber amplifiers, the wavelength output by the master oscillator 102 may be in an eye-safe wavelength range (such as about 1825 nanometers to about 1925 nanometers), and each preamplifier 118 may be pumped by a source 124 representing an Er-doped fiber laser operating at a wavelength of about 1550 nanometers to about 1580 nanometers. This is often referred to as "in-band" optical pumping, which involves optical pumping directly into the emitting $^3F_4$ upper energy level of the thulium dopants. The Raman fiber amplifier 136 here converts the master oscillator's wavelength range of about 1825 nanometers to about 1925 nanometers into a corresponding first-order Stokes shifted, eye-safe wavelength range of about 1971.5 nanometers to about 2088 nanometers. This is within the Tm-doped fiber emission bandwidth, meaning the optical amplifier 128 may also be implemented using a Tm-doped fiber amplifier. The optical amplifier 128 here can be optically pumped in-band like the preamplifiers 118 or diode-pumped, such as at a wavelength of about 780 nanometers to about 790 nanometers.

Figure 9:
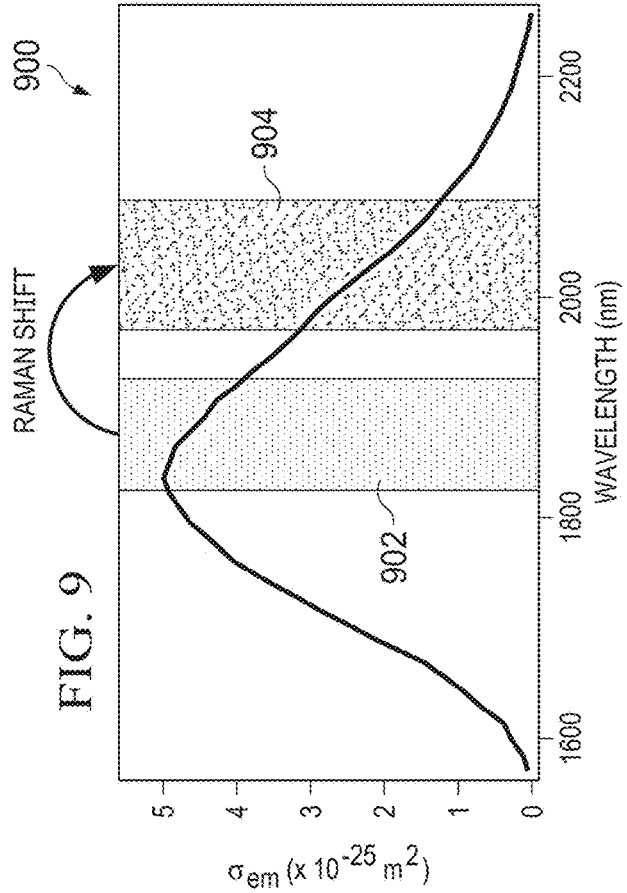
FIG. 9 illustrates an example graph plotting another optical emission cross-section against emission wavelength for another typical fiber according to this disclosure.

FIG. 9 illustrates an example graph 900 plotting another optical emission cross-section against emission wavelength for another typical fiber according to this disclosure. In particular, the graph 900 plots an optical emission cross-section against emission wavelength for a typical Tm-doped fiber. As can be inferred from FIG. 9, if a Tm-doped Raman fiber amplifier 136 is seeded to operate at a wavelength in a specified range 902 (such as about 1825 nanometers to about 1925 nanometers), each wavelength in this range 902 would be Raman-shifted to a longer wavelength in a corresponding range 904 (such as about 1971.5 nanometers to about 2088 nanometers). This still lies within the Tm emission spectrum. As a result, the Raman-shifted signal from the Raman fiber amplifier 136 can still be amplified by a Tm-doped optical amplifier 128.

While a single Raman fiber amplifier 136 has been described above as being used in the laser transmitter 100, other numbers of Raman fiber amplifiers may be used to achieve desired operating characteristics. For example, multiple Raman fiber amplifiers in a cascaded configuration may be used in a high-pulse-contrast fiber laser transmitter.

Figure 10:
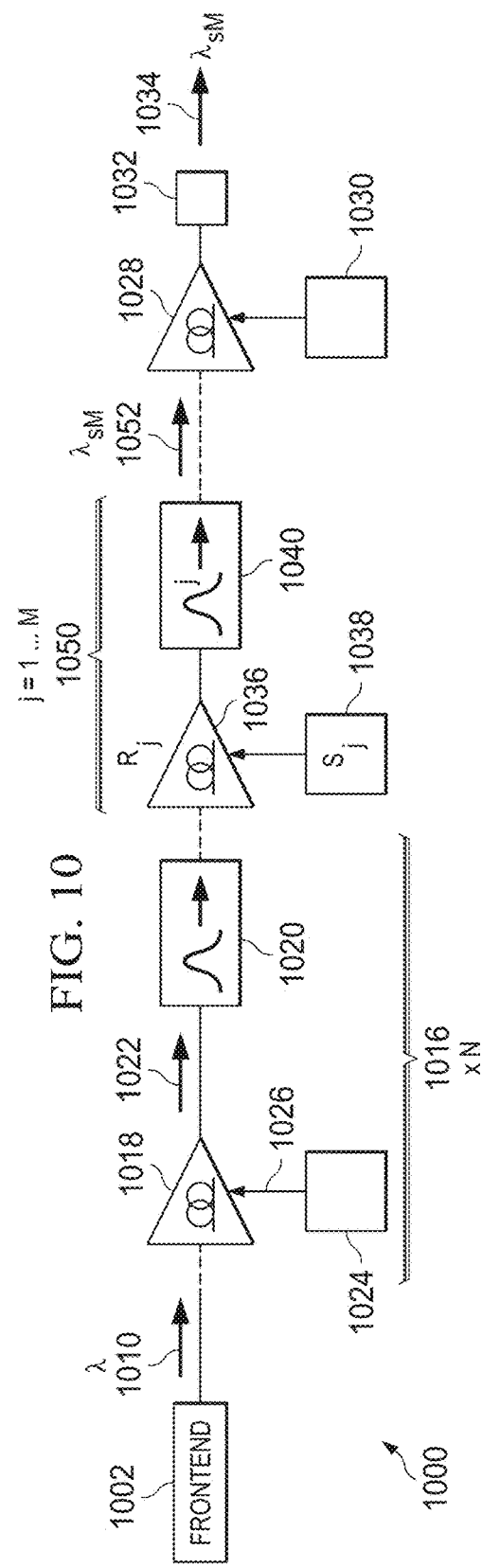
FIG. 10 illustrates a second example high-pulse-contrast fiber laser transmitter according to this disclosure.

FIG. 10 illustrates a second example high-pulse-contrast fiber laser transmitter 1000 according to this disclosure. As shown in FIG. 10, the laser transmitter 1000 includes a frontend 1002, which may include the master oscillator 102, the amplitude modulator 104, the time gate 106, and the phase modulator 108 (which can produce a seed signal 1010), as well as the electronic pulse driver 112 and the optical filter and isolator block 114. The laser transmitter 1000 also includes a series 1016 of N preamplifier-filter/isolator units, where each unit includes a fiber-based optical preamplifier 1018 and an optical filter and isolator block 1020. Each optical preamplifier 1018 generates an amplified optical signal 1022 and is coupled to a diode laser or other source 1024 of optical power using a coupler 1026. A final fiber-based optical amplifier 1028 is used to amplify an optical signal and can be optically pumped by a source 1030. An output beam-expanding endcap 1032 can be used to expand the amplified optical signal from the optical amplifier 1028 in order to produce an output optical signal 1034. These components can be the same as or similar to corresponding components in FIG. 1 and described above.

In order to achieve an improved optical pulse contrast in the laser transmitter 1000, the laser transmitter 1000 includes a series 1050 of M Raman fiber amplification units, where each unit includes a seeded Raman fiber amplifier 1036 and a seeder source 1038 for the Raman fiber amplifier 1036. Each unit may also include an additional optical filter and isolator block 1040 optically positioned after the Raman fiber amplifier 1036 in that unit. The Raman fiber amplifiers 1036 generally operate to amplify input optical signals using Raman amplification, and the final Raman fiber amplifier 1036 produces an optical signal 1052 that is filtered by the final optical filter and isolator block 1040. The optical power for the Raman amplification in each Raman fiber amplifier 1036 is provided by the associated seeder source 1038.

In this type of laser transmitter 1000, the laser transmitter 1000 can be configured to generate a high-OPC pulsed output at an eye-safe wavelength, such as in the range of about 1546 nanometers to about 1598 nanometers. Again, the laser transmitter 1000 features an all-fiber-based frontend 1002, which emits an output beam of wavelength (such as in the range of about 1065 nanometers to about 1090 nanometers). The frontend 1002 is followed by the series 1016 of preamplifiers 1018 (such as Yb-based fiber amplifiers), and the preamplified output beam is injected into a cascaded Raman fiber shifter that is formed by the series 1050 of Raman fiber amplification units. Each optical filter and isolator block 1040 can have a passband centered at the wavelength generated by the preceding Raman fiber amplification unit. The signal 1052 from the final Raman fiber amplification unit is amplified by the optical amplifier 1028 (such as an Er-doped fiber amplifier). Since the signal 1052 is produced in a Raman amplifier (analogous to the output of the Raman fiber amplifier 136), it possesses high OPC properties that enable the optical amplifier 1028 to achieve a high optical pulse contrast (as is the case for the optical amplifier 128).

In some embodiments, each Raman fiber amplifier 1036 may include a segment of fused-silica-core fiber or doped-silica-core fiber (similar in composition and design to the Raman fiber amplifier 136 in FIG. 1). The purpose of the first segment of fiber in the first Raman fiber amplifier 1036 is to convert pulse power from the pump beam at wavelength $\lambda$ into a first-order Stokes wavelength $\lambda_{s1}$. The purpose of each successive segment of fiber in the subsequent Raman fiber amplifiers 1036 is to convert pulse power from the $j^{th}$-order Stokes beam at wavelength $\lambda_{sj}$ into the $(j+1)^{th}$-order Stokes beam at wavelength $\lambda_{sj+1}$ via successive Raman shifting steps. In particular embodiments, the series 1050 includes seven Raman fiber amplifiers 1036, which can collectively provide seven Stokes-shifted wavelengths. Table 2 below lists example values for seven successive Stokes wavelengths corresponding to the minimum and maximum values of Raman pump wavelengths $\lambda$ (1065 and 1090 nm) generated by the master oscillator 102 in the frontend 1002.

TABLE 2

Minimum and maximum wavelengths for Raman pump and corresponding Stokes-shifted beams characterizing the architecture illustrated in FIG. 10

| Wavelength | Minimum | Maximum |
|---|---|---|
| Raman pump, $\lambda$ | 1065 nm | 1090 nm |
| $1^{st}$ Stokes, $\lambda_{s1}$ | 1114.9 nm | 1142.3 nm |
| $2^{nd}$ Stokes, $\lambda_{s2}$ | 1169.6 nm | 1199.7 nm |
| $3^{rd}$ Stokes, $\lambda_{s3}$ | 1229.8 nm | 1263 nm |
| $4^{th}$ Stokes, $\lambda_{s4}$ | 1296.3 nm | 1333.2 nm |
| $5^{th}$ Stokes, $\lambda_{s5}$ | 1370.3 nm | 1411.4 nm |
| $6^{th}$ Stokes, $\lambda_{s6}$ | 1452.9 nm | 1499 nm |
| $7^{th}$ Stokes, $\lambda_{s7}$ | 1545.8 nm | 1597.9 nm |

The cascaded Raman fiber shifter in FIG. 10 is designed such that the wavelength $\lambda_{sM}$, emitted by the last Raman fiber amplifier 1036, lies within the emission bandwidth of the optical amplifier 1028 (such as about 1545 nanometers to about 1598 nanometers for an Er-doped optical amplifier 1028). Thus, the beam emitted by the last Raman fiber amplifier 1036 can serve as a high-pulse-contrast seed beam for the optical amplifier 1028. Each Raman fiber amplifier 1036 can be seeded by a Raman seeder source 1038, which can be similar to the one used in FIG. 1 (such as an externally-modulated fiber-coupled diode laser). Each Raman seeder source 1038 can emit a wavelength matching the Stokes wavelength of the associated Raman fiber amplifier 1036. After each Raman fiber amplifier 1036, the optical filter and isolator block 1040 provides filtering and back-propagation isolation.

Although FIGS. 1 through 10 illustrate examples of high-pulse-contrast fiber laser transmitters 100 and 1000 and related details, various changes may be made to FIGS. 1 through 10. For example, the specific wavelengths, dopants, fiber dimensions, and other specific details provided above are for illustration only and can vary as needed or desired. Also, one or more seeded Raman fiber amplifiers may be used in any other suitable laser transmitter in order to provide an improved optical pulse contrast.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112 (f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112 (f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    a signal seeder configured to generate a pulsed seed signal, the signal seeder comprising a master oscillator configured to generate an optical signal at a first wavelength;
    a series of optical preamplifiers collectively configured to amplify the pulsed seed signal and generate an amplified signal; and
    a Raman fiber amplifier configured to amplify the amplified signal and generate a Raman-shifted amplified signal, the Raman fiber amplifier configured to shift a wavelength of the amplified signal to a second wavelength different than the first wavelength during generation of the Raman-shifted amplified signal;
    wherein the second wavelength is within one or more of an emission spectrum of ytterbium or an emission spectrum of thulium.

2. The system of claim 1, further comprising:
    an optical amplifier configured to amplify the Raman-shifted amplified signal.

3. The system of claim 2, wherein:
    the optical preamplifiers comprise rare-earth-doped fiber amplifiers; and
    the optical amplifier comprises an additional rare-earth-doped fiber amplifier.

4. The system of claim 3, wherein:
    the rare-earth-doped fiber amplifiers and the additional rare-earth-doped fiber amplifier comprise ytterbium-doped fiber amplifiers;
    the signal seeder is configured to generate the pulsed seed signal at a wavelength in a range of about 1015 nanometers to about 1047 nanometers; and
    the Raman fiber amplifier is configured to shift the wavelength of the amplified signal to the second wavelength in a range of about 1060.3 nanometers to about 1095 nanometers; and
    the second wavelength is within the emission spectrum of ytterbium.

5. The system of claim 3, wherein:
    the rare-earth-doped fiber amplifiers and the additional rare-earth-doped fiber amplifier comprise thulium-doped fiber amplifiers;
    the signal seeder is configured to generate the pulsed seed signal at a wavelength in a range of about 1825 nanometers to about 1925 nanometers;
    the Raman fiber amplifier is configured to shift the wavelength of the amplified signal to the second wavelength in a range of about 1971.5 nanometers to about 2088 nanometers; and
    the second wavelength is within the emission spectrum of thulium.

6. The system of claim 3, wherein:
    each of the rare-earth-doped fiber amplifiers and the additional rare-earth-doped fiber amplifier is configured to be optically pumped by a laser source; and
    the Raman fiber amplifier is configured to be optically pumped by a seeder source, the seeder source configured to produce optical energy substantially at the second wavelength.

7. A system comprising:
    a signal seeder configured to generate a pulsed seed signal, the signal seeder comprising a master oscillator configured to generate an optical signal at a first wavelength;
    a series of optical preamplifiers collectively configured to amplify the pulsed seed signal and generate an amplified signal; and
    multiple Raman fiber amplifiers in a cascaded configuration configured to amplify the amplified signal, each Raman fiber amplifier configured to provide a Raman shift, a final one of the Raman fiber amplifiers configured to generate a Raman-shifted amplified signal that has been Stokes-shifted multiple times by the cascaded configuration of Raman fiber amplifiers, the Raman fiber amplifiers configured to shift a wavelength of the amplified signal to a second wavelength different than the first wavelength during generation of the Raman-shifted amplified signal.

8. A system comprising:
    a signal seeder configured to generate a pulsed seed signal, the signal seeder comprising a master oscillator configured to generate an optical signal at a first wavelength;
    a series of optical preamplifiers collectively configured to amplify the pulsed seed signal and generate an amplified signal; and
    a Raman fiber amplifier configured to amplify the amplified signal and generate a Raman-shifted amplified signal, the Raman fiber amplifier configured to shift a wavelength of the amplified signal to a second wavelength different than the first wavelength during generation of the Raman-shifted amplified signal;
    wherein the signal seeder further comprises at least one of:
        one or more amplitude modulators configured to modulate an amplitude of the optical signal; and
        a time gate configured to selectively block and pass the optical signal.

9. The system of claim 1, wherein the signal seeder is configured to generate the pulsed seed signal having substantially flat-top pulses with steep rising and falling edges.

10. The system of claim 1, further comprising:
    multiple optical filters configured to limit frequencies or wavelengths of optical energy flowing through the system; and
    multiple optical isolators configured to reduce or prevent back-propagation of optical energy through the system.

11. A method comprising:
    generating a pulsed seed signal based on an optical signal at a first wavelength;
    amplifying the pulsed seed signal to generate an amplified signal using a series of optical preamplifiers; and
    amplifying the amplified signal to generate a Raman-shifted amplified signal using a Raman fiber amplifier, the Raman fiber amplifier shifting a wavelength of the amplified signal to a second wavelength different than the first wavelength during generation of the Raman-shifted amplified signal; and
    wherein the second wavelength is within one or more of an emission spectrum of ytterbium or an emission spectrum of thulium.

12. The method of claim 11, further comprising:
    amplifying the Raman-shifted amplified signal using an optical amplifier.

13. The method of claim 12, wherein:
    the optical preamplifiers comprise rare-earth-doped fiber amplifiers; and
    the optical amplifier comprises an additional rare-earth-doped fiber amplifier.

14. The method of claim 13, wherein:
the rare-earth-doped fiber amplifiers and the additional rare-earth-doped fiber amplifier comprise ytterbium-doped fiber amplifiers;
the pulsed seed signal has a wavelength in a range of about 1015 nanometers to about 1047 nanometers;
the Raman fiber amplifier shifts the wavelength of the amplified signal to the second wavelength in a range of about 1060.3 nanometers to about 1095 nanometers; and
the second wavelength is within the emission spectrum of ytterbium.

15. The method of claim 13, wherein:
the rare-earth-doped fiber amplifiers and the additional rare-earth-doped fiber amplifier comprise thulium-doped fiber amplifiers;
the pulsed seed signal has a wavelength in a range of about 1825 nanometers to about 1925 nanometers;
the Raman fiber amplifier shifts the wavelength of the amplified signal to the second wavelength in a range of about 1971.5 nanometers to about 2088 nanometers; and
the second wavelength is within the emission spectrum of thulium.

16. The method of claim 13, wherein:
each of the rare-earth-doped fiber amplifiers and the additional rare-earth-doped fiber amplifier is optically pumped by a laser source; and
the Raman fiber amplifier is optically pumped by a seeder source, the seeder source producing optical energy substantially at the second wavelength.

17. The method of claim 12, wherein:
amplifying the amplified signal to generate the Raman-shifted amplified signal comprises using multiple Raman fiber amplifiers in a cascaded configuration;
each Raman fiber amplifier provides a Raman shift; and
a final one of the Raman fiber amplifiers generates the Raman-shifted amplified signal that has been Stokes-shifted multiple times by the cascaded configuration of Raman fiber amplifiers.

18. The method of claim 11, wherein generating the pulsed seed signal further comprises at least one of:
modulating an amplitude of the optical signal; and
selectively blocking and passing the optical signal.

19. The method of claim 11, wherein the pulsed seed signal has substantially flat-top pulses with steep rising and falling edges.

20. The method of claim 11, further comprising:
limiting frequencies or wavelengths of optical energy flowing through a laser transmitter that includes the optical preamplifiers and the Raman fiber amplifier; and
reducing or preventing back-propagation of optical energy through the laser transmitter.

* * * * *